United States Patent
Fuller

(10) Patent No.: US 11,778,728 B2
(45) Date of Patent: Oct. 3, 2023

(54) PASS-THROUGH LATCHING HEAT SINK

(71) Applicant: ARRIS Enterprises LLC, Suwanee, GA (US)

(72) Inventor: Colin Fuller, Shipley (GB)

(73) Assignee: ARRIS Enterprises LLC, Suwanee, GA (US)

( * ) Notice: Subject to any disclaimer, the term of this patent is extended or adjusted under 35 U.S.C. 154(b) by 0 days.

(21) Appl. No.: 17/467,827

(22) Filed: Sep. 7, 2021

(65) Prior Publication Data

US 2022/0132649 A1 Apr. 28, 2022

Related U.S. Application Data

(60) Provisional application No. 63/106,518, filed on Oct. 28, 2020.

(51) Int. Cl.
*H05K 1/02* (2006.01)
*G06F 1/20* (2006.01)

(52) U.S. Cl.
CPC .............. *H05K 1/021* (2013.01); *G06F 1/20* (2013.01)

(58) Field of Classification Search
CPC .............. H05K 7/2039; H05K 7/2049; H05K 7/20154; H05K 7/20509; H05K 7/20963; H05K 7/20854; H05K 1/0201–0203; H05K 1/021; H01L 23/367; H01L 23/40; H01L 23/4093; H01L 23/4081; H01L 23/4087; H01L 2023/4037; H01L 2023/405; H01L 2023/4062; H01L 2023/4081; H01L 2023/4075–4087; G06F 1/20; G06F 1/203; F16B 21/00
See application file for complete search history.

(56) References Cited

U.S. PATENT DOCUMENTS

| | | | | |
|---|---|---|---|---|
| 6,742,573 B2 * | 6/2004 | Sasaki | ................. | H01L 23/3672 |
| | | | | 174/16.3 |
| 9,668,335 B1 * | 5/2017 | Canseco | ................... | F28F 3/02 |
| 10,172,265 B2 * | 1/2019 | Wrona | ................. | H05K 9/0081 |
| 2003/0131973 A1 | 7/2003 | Nair et al. | | |
| 2010/0097804 A1 * | 4/2010 | Wung | ................. | F21V 19/0035 |
| | | | | 362/249.02 |

(Continued)

FOREIGN PATENT DOCUMENTS

FR 3 056 016 A1 3/2018

OTHER PUBLICATIONS

Notification of Transmittal of the International Search Report (Forms PCT/ISA/220 and PCT/ISA/210) and the Written Opinion of the International Searching Authority (Form PCT/ISA/237) dated Dec. 30, 2021, by the International Application Division Korean Intellectual Property Office in corresponding International Application No. PCT/US2021/049214. (12 pages).

*Primary Examiner* — Amir A Jalali
(74) *Attorney, Agent, or Firm* — Panitch Schwarze Belisario & Nadel LLC

(57) ABSTRACT

An assembly configured to dissipate heat in a gateway, the assembly including: a bracket, the bracket including one or more openings extending from a front side to a back side of the vertically oriented bracket; and a plurality of heat sink fins attached to a base member, and wherein the base member is configured to be attachable to a front side of the bracket and the plurality of heat sink fins extend through the one or more openings to a back side of the bracket.

19 Claims, 8 Drawing Sheets

(56) References Cited

U.S. PATENT DOCUMENTS

| | | | |
|---|---|---|---|
| 2011/0255247 A1* | 10/2011 | Chu | H05K 9/0022 361/709 |
| 2012/0227952 A1* | 9/2012 | Yoshihara | F28F 3/02 165/185 |
| 2015/0282388 A1* | 10/2015 | Carpenter | H05K 9/0022 361/720 |
| 2017/0374770 A1* | 12/2017 | Wang | H05K 9/0024 |
| 2020/0174534 A1* | 6/2020 | Ganta Papa Rao Bala | G06F 1/181 |
| 2020/0315065 A1* | 10/2020 | Sinn | H05K 7/20409 |
| 2020/0413564 A1* | 12/2020 | Schörner | H05K 7/2039 |
| 2021/0159007 A1* | 5/2021 | Dede | H01F 27/266 |

* cited by examiner

PASS-THROUGH LATCHING HEAT SINK

TECHNICAL FIELD

The present disclosure generally relates to a pass-through latching heat sink, and more particularly, to a pass-through latching heat sink for use with customer-premise equipment or customer-provided equipment (CPE), for example, a broadband wireless gateway.

BACKGROUND

Cable service providers, which are also referred to as Multiple System Operators ("MSO"), or any communication or content distribution business that operates through a cable network, renders its services to its subscribers. The services can include, but are not limited to, different subscription plans for broadband Internet access and telephony. In order to consume these services, subscribers connect to a private network owned (or co-owned or rented) by the broadband cable operator which is implemented according to the Data Over Cable Service Interface Specification (DOCSIS) standard. Subscribers connect their computers, routers, voice-over-IP telephones and other devices to this network through the network terminals, for example, cable modems (CM) or network gateways.

To provide television and data services, a MSO typically uses a Cable Modem Termination System ("CMTS") for the data services and a quadrature amplitude modulation ("QAM") multiplexer for downstream broadcast television, narrow cast and video-on-demand (VoD) traffic signals. These devices may be located at one or more hubs, which are typically connected to a head end via a network according to a networking protocol, such as Ethernet or SONET. A residential cable customer is typically connected to the CMTS and hub via a cable modem and a wireless router that may be combined in a single box which is called a gateway.

Customer-premise equipment or customer-provided equipment (CPE) in the form of gateways, for example, can include a vertically oriented main printed circuit board (PCB) and a vertically oriented Wi-Fi printed circuit board (PCB). The main PCB and Wi-Fi PCB can be mounted onto a central bracket, for example, a sheet metal bracket, within the gateway. Since the front-end modules (FEMs) on the Wi-Fi printed circuit board can dissipate a significant amount of heat, it would be desirable to improve reliability of the gateway or CPE through the use of a pass-through heat sink.

SUMMARY

In accordance with an aspect, an assembly is disclosed configured to dissipate heat in a gateway, the assembly comprising: a bracket, the bracket including one or more openings extending from a front side to a back side of the vertically oriented bracket; and a plurality of heat sink fins attached to a base member, and wherein the base member is configured to be attachable to a front side of the bracket and the plurality of heat sink fins extend through the one or more openings to a back side of the bracket.

In accordance with an another aspect, an assembly is disclosed comprising: a vertically oriented main printed circuit board; a vertically oriented Wi-Fi printed circuit board with one or more front-end modules configured to deliver broadband wireless access; a vertically oriented bracket arranged between the vertically oriented main printed circuit board and the vertically oriented Wi-Fi printed circuit board, the bracket including one or more openings extending from a front side to a back side of the vertically oriented bracket; and a plurality of heat sink fins attached to a base member, and wherein the base member is configured to be attachable to the front side of the bracket and the plurality of heat sink fins extend through the one or more openings to the back side of the bracket, the front side of the bracket being on a side of the vertically oriented Wi-Fi printed circuit board and the back side being on a side of the vertically oriented main printed circuit board.

Further areas of applicability of the present disclosure will become apparent from the detailed description provided hereinafter. It should be understood that the detailed description of exemplary embodiments are intended for illustration purposes only and are, therefore, not intended to necessarily limit the scope of the disclosure.

DETAILED DESCRIPTION

For simplicity and illustrative purposes, the principles of the embodiments are described by referring mainly to examples thereof. In the following description, numerous specific details are set forth in order to provide a thorough understanding of the embodiments. It will be apparent however, to one of ordinary skill in the art, that the embodiments may be practiced without limitation to these specific details. In some instances, well known methods and structures have not been described in detail so as not to unnecessarily obscure the embodiments.

System

Figure 1:
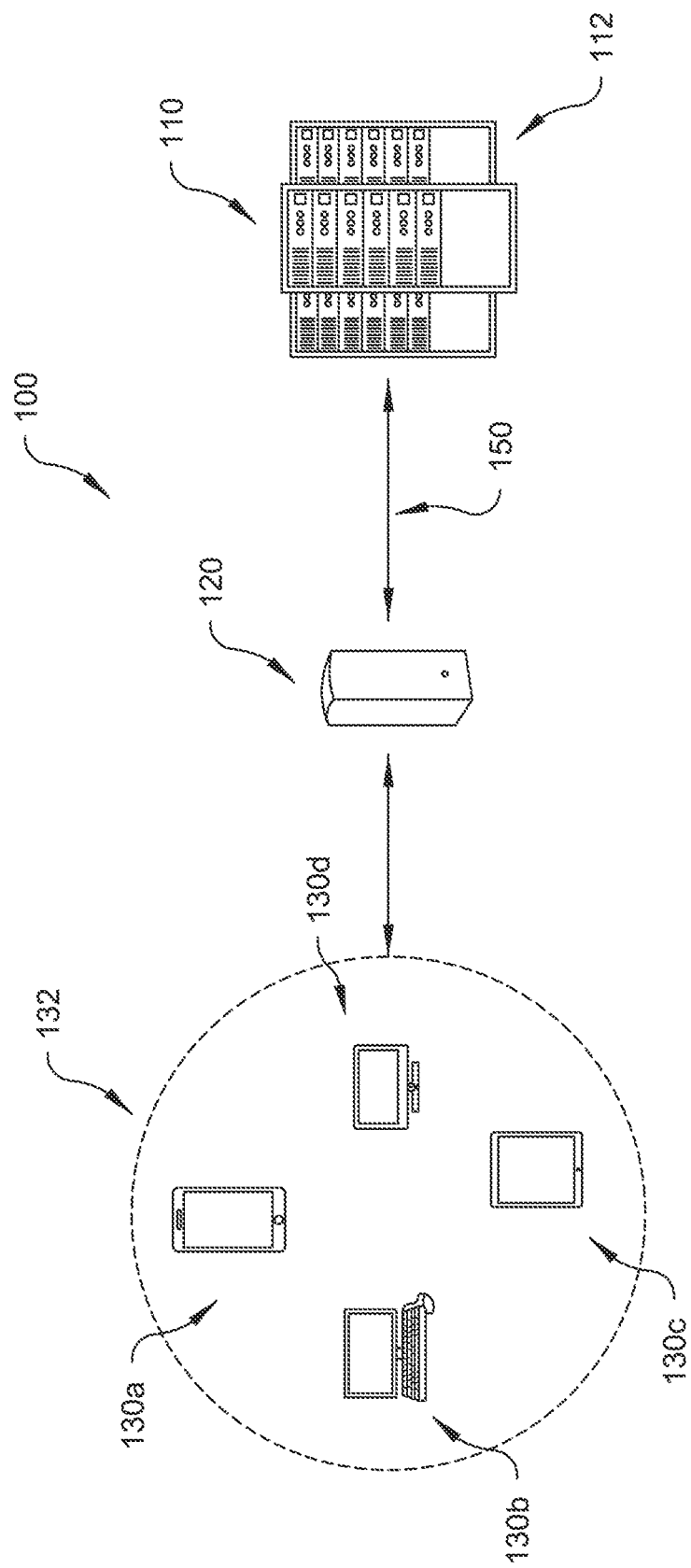
FIG. 1 is an illustration of an exemplary network environment in which a gateway is used in accordance with an exemplary embodiment.

FIG. 1 depicts a block diagram of a high-level system architecture for providing voice, video, data and IoT services over a fixed wireless broadband access network in accordance with an exemplary embodiment. The architecture may be embodied in a system 100, which includes one or more servers 110, for example, of a cable service provider 112, a customer-premise equipment or customer-provided equipment (CPE) in the form of a gateway 120, and a plurality of devices or clients 130*a*, 130*b*, 130*c*, 130*d*. In accordance with an exemplary embodiment, the gateway 120 can be, for example, a smart media device (SMD).

In embodiments, the gateway 120 can provide, for example, voice, video, data, and/or IoT services to a plurality of devices or clients 130a, 130b, 130c, 130d. The gateway 120 may communicate with the plurality of devices 130a, 130b, 130c, 130d over a local network 132 (for example, a local area network (LAN), a wireless local area network (WLAN), a personal area network (PAN), etc.) and/or wired, connected to a modem, and may communicate with an upstream wide area network (WAN) through a connection 150 to the one or more servers 110, for example, of the cable service provider 112. The one or more servers 110 can provide high-bandwidth data transfer, for example, cable television and broadband Internet access via, for example, the connection 150.

In accordance with an exemplary embodiment, the gateway 120 and the plurality of devices 130a, 130b, 130c, 130d can be configured to connect via a wireless network, for example, wireless network utilizing an IEEE 802.11 specification, including a smart phone, a smart TV, a computer, a mobile device, a tablet, a router, a home security system, or any other device operable to communicate wirelessly with the gateway 120. The gateway 120 may provide access to an external network, such as the Internet, for any devices connected thereto via the area network 132. The area network 132 may be, for instance a local area. In accordance with an exemplary embodiment, the gateway 120 may be a smart media device, a gateway device, an access point, a modem, a wireless router including an embedded modem, a wireless network extender or any other device operable to deliver, for example, data and/or video services from the one or more servers 110 of the cable service provider 112 and/or a wide area network (WAN) to one or more of the plurality of devices 130a, 130b, 130c, 130d.

In accordance with an exemplary embodiment, the gateway 120 may communicate with the one or more servers 110 over a wired or a wireless connection. A wireless connection between the one or more servers 110 of the cable service provider 112 and the gateway 120 may be established through a protected setup sequence (for example, Wi-Fi protected setup (WPS)). The protected setup sequence may include the steps of scanning multiple wireless channels for an available access point, exchanging one or more messages between a station and access point, exchanging key messages (for example, pre-shared key (PSK)) between the station and access point, and installing a key (for example, PSK) at the station.

Figure 2:
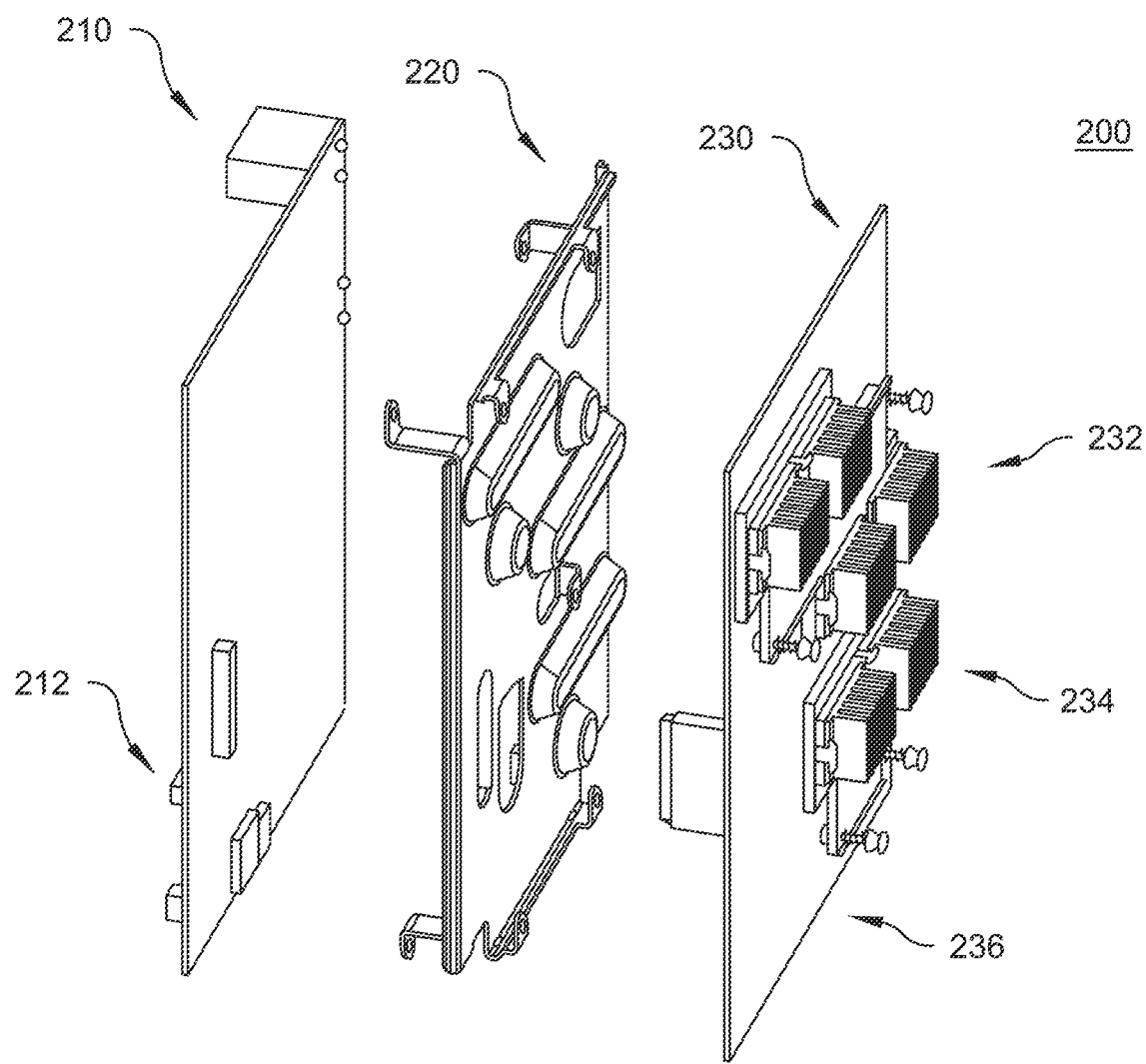
FIG. 2 is an illustration of a main printed circuit board, a central bracket, and a Wi-Fi printed circuit board for use in a gateway in accordance with an exemplary embodiment.

FIG. 2 is an illustration of a main printed circuit board 210 and a Wi-Fi printed circuit board 230 with a central bracket 220 in accordance with an exemplary embodiment. As shown in FIG. 2, the main printed circuit board 210 and the WiFi printed circuit board 230 include one or more electrical components 212, 232 that are configured to carry out the functionality of the gateway 120. For example, the WiFi printed circuit board 230 can include one or more front-end modules (FEMs) 234 arranged on a front side 236 of the WiFi printed circuit board 230 and configured to deliver, for example, broadband wireless access. For example, the functionality of the front-end modules 234 can include power amplifier (PA), filtering, power detector, transmit/receive (T/R) switch, diplexer, and associated matching. The main printed circuit board 210 and the WiFi printed circuit board 230 are mounted on each side of the central bracket 220. The central bracket 220 is preferably, for example, made from sheet metal, for example, aluminum or an aluminum alloy.

Figure 3:
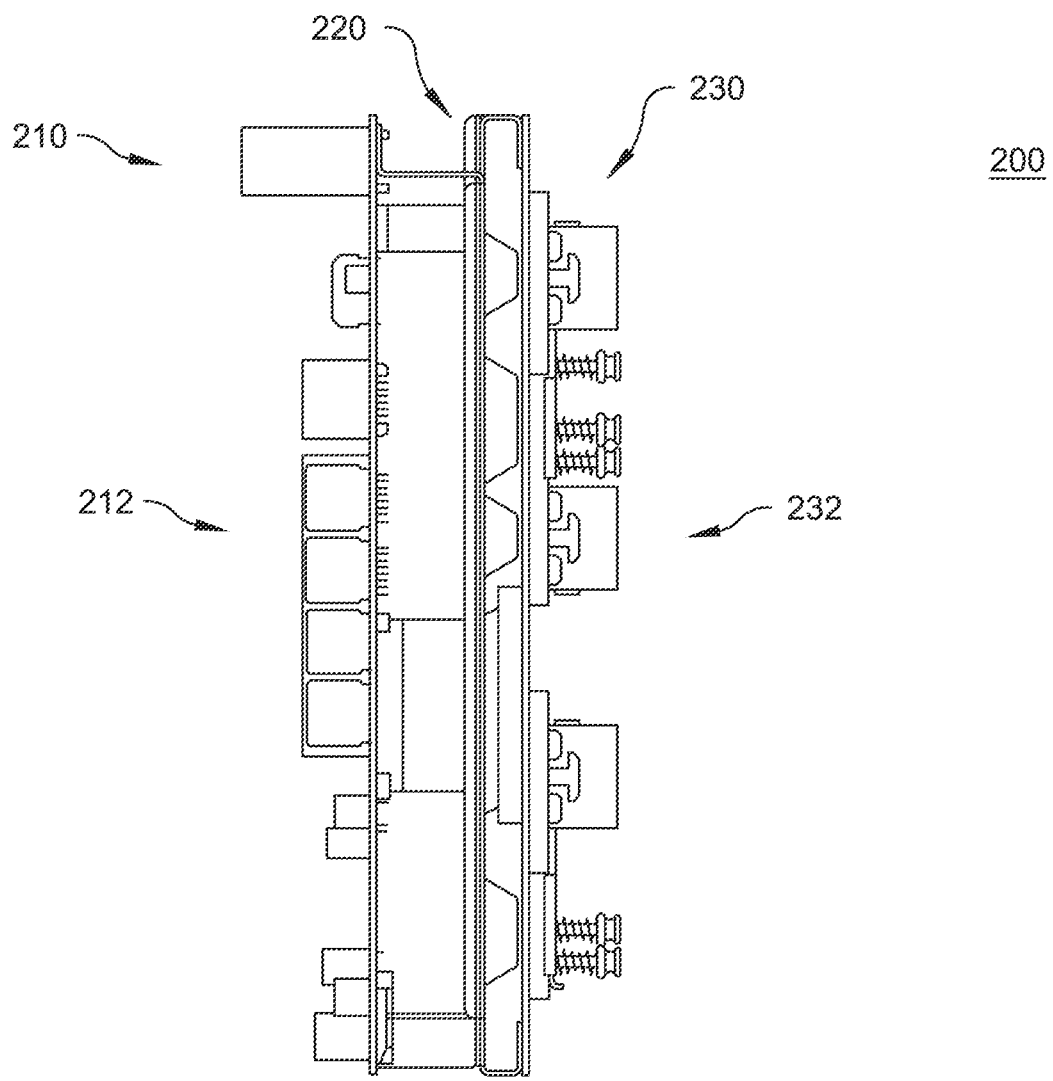
FIG. 3 is an illustration of an assembly of the main printed circuit board, the central bracket, and the WiFi printed circuit board in accordance with an exemplary embodiment.

FIG. 3 is an illustration of an assembly 200 of the main printed circuit board 210, the central bracket 220, and the WiFi printed circuit board 230 in accordance with an exemplary embodiment. As shown in FIG. 3, when the main printed circuit board 210 and the WiFi printed circuit board 230 are mounted to the central bracket 220, the gap or spacing between the WiFi printed circuit board 230 and the central bracket 220 is relatively limited. For example, the gap between the WiFi printed circuit board 230 and the central bracket 220 can be, for example, as small as 7 mm. Accordingly, to improve the reliability of the gateway 120, the front-end modules 232 on the WiFi printed circuit board 230 can be cooled by the use of one or more sets of pass-through heat sinks as disclosed herein.

Bracket with Pass-Through Heat Sink

Figure 4:
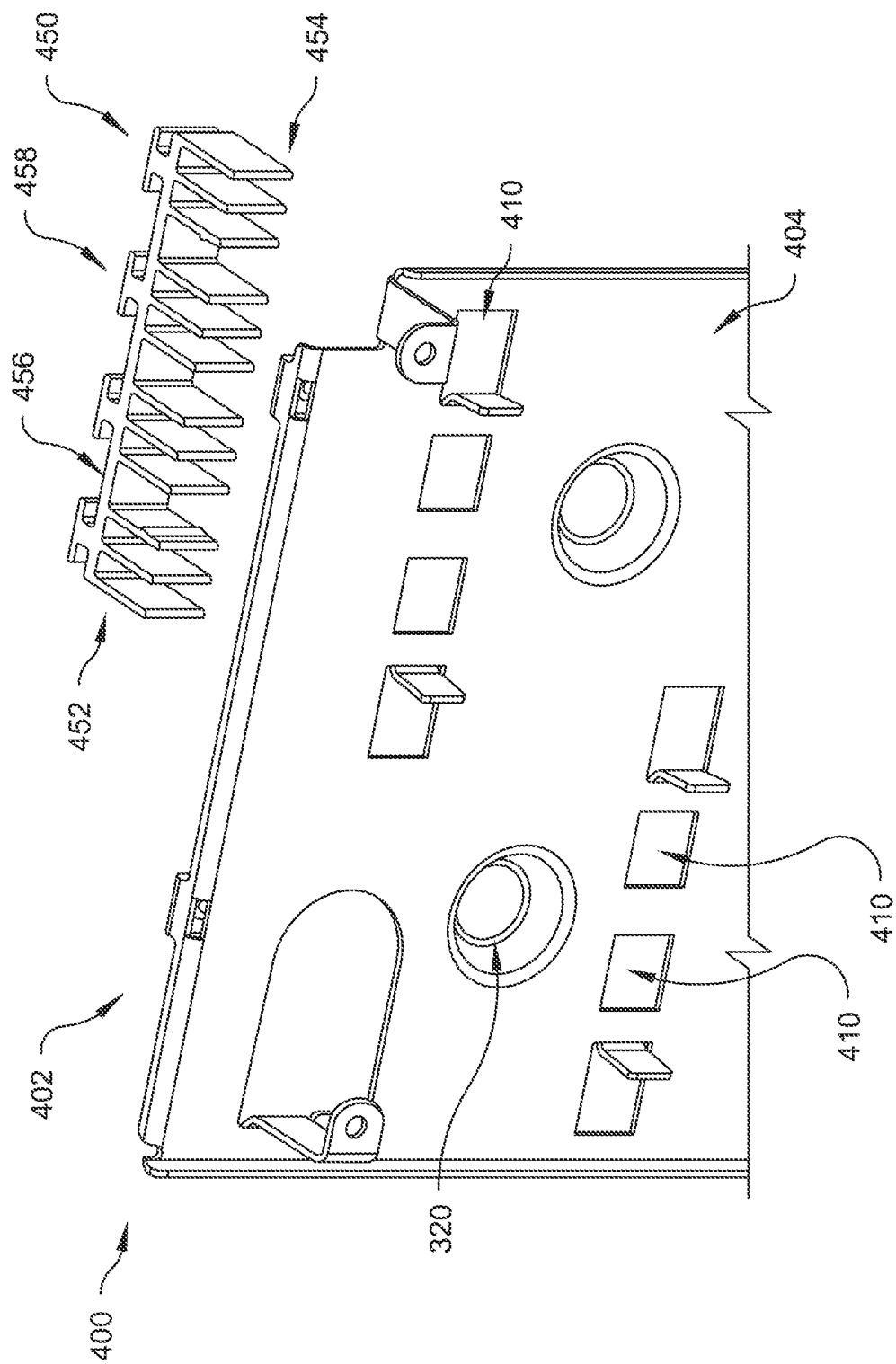
FIG. 4 is an illustration of a portion of a central bracket having a pass-through heat sink in accordance with an exemplary embodiment.

FIG. 4 is an illustration of a portion of a central bracket 400 having a pass-through heat sink 450 in accordance with an exemplary embodiment. As shown in FIG. 4, in order to make use of cooler air or airflow between the central bracket 400 and the main printed circuit board 210, one or more openings (or bracket holes) 410 can be added to the central bracket 400 to help improve the cooling of the front-end modules 232 on the Wi-Fi printed circuit board 230.

In accordance with an exemplary embodiment, each of the pass-through heat sinks 450 includes a plurality of heat sink fins 452 configured to pass through the one or more openings (or bracket holes) 410 into the region of the cooler air between the main printed circuit board 210 and the central bracket 400. In accordance with an exemplary embodiment, the plurality of heat sink fins 452 are arranged in two or more sets (or groups) heat sink fins 454. In addition, each of the plurality of heat sink fins 452 can be attached to a base member 456. The base member 456 can include one or more support members 458 on an opposite side of the base member 456 than the plurality of heat sink fins 452. The base member 456 being configured to be arranged horizontally on a front side 402 of the bracket 400. Each of the plurality of heat sink fins 452 being configured to extend through the one or more openings 410 in the bracket to a back side 404 of the bracket 400. In accordance with an exemplary embodiment, the plurality of heat sink fins 452 can be made, for example, from aluminum, an aluminum alloy, copper, and/or a copper alloy. In accordance with an exemplary embodiment, an aluminum pass-through heat sink 450 can be produced as an extruded part, to help minimize part production costs.

As shown in FIG. 4, the base member 456 of each of the pass-through heat sinks 450 can be arranged, for example, horizontally on the bracket 400. In addition, the plurality of heat sink fins 452 in each of the pass-through heat sinks 450 may be arranged in sets or groups 454 of 2 heat sink fins 452 to 5 heat sink fins 452. In accordance with an exemplary embodiment, a number of sets 454 of heat sink fins 452 for each of the pass-through heat sinks 450 may be, for example, 1 sets to 7 sets, for example, 3 sets to 5 sets, for example, 4 sets. For example, for a pass-through heat sink 450, the number of sets 454 of heat sink fins 452 may be 4 sets with three (3) heat sink fins 452 in each set 454. For example, as shown in FIG. 4, the pass-through heat sink 450 includes a total of twelve (12) heat sink fins 452.

In addition, as shown in FIG. 4, the central bracket 400 can include optional heat sink domes 320. For example, the heat sink domes 320 can be circular or oval domes with a hollow back side that faces the front side of the main printed circuit board 210.

Figure 5:
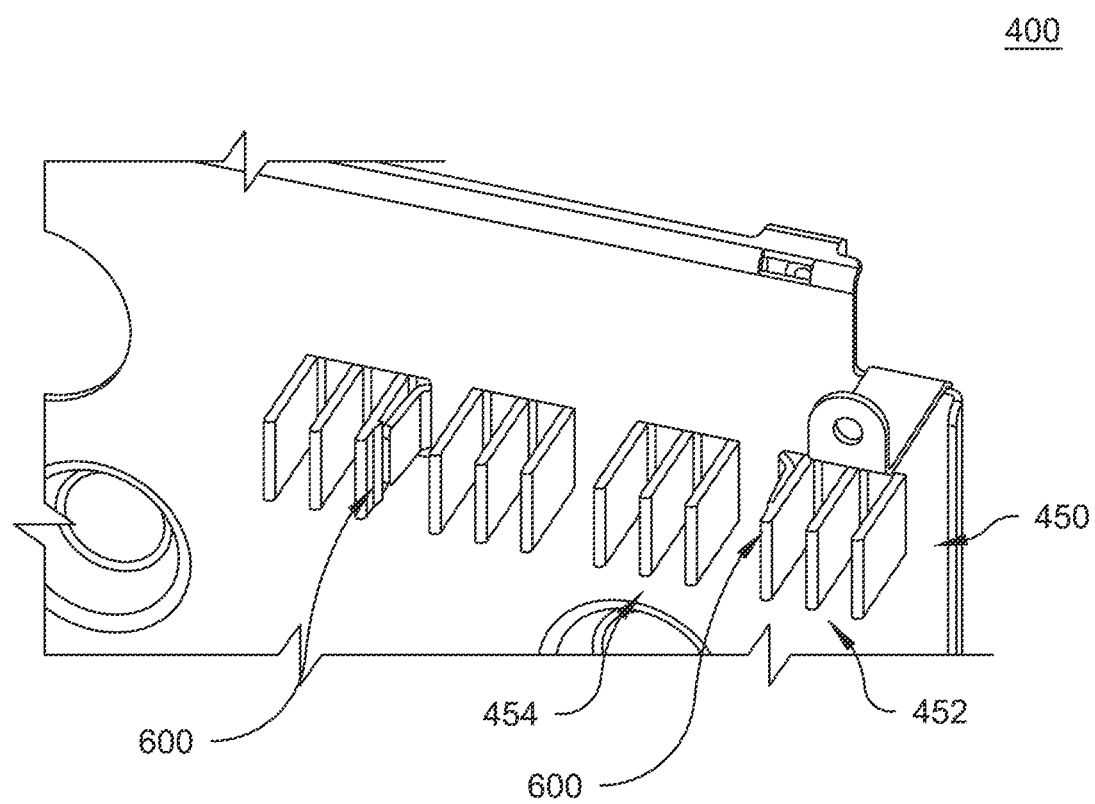
FIG. 5 is an illustration of a portion of the central bracket as shown in FIG. 4 in an assembled state in which the one or more sets of heat sink fins on the pass-through heat sink protrudes through the central bracket to an opposite side of the central bracket.

FIG. 5 is an illustration of a portion of the central bracket 400 as shown in FIG. 4 in an assembled state in which the one or more sets 454 of heat sink fins 452 protrude through the bracket 400 from the front side 402 to the back side 404 of the central bracket 400. As shown in FIG. 5, the pass-through heat sink 450 can include two or more sets 454 of heat sink fins 452, which are configured to be received within the openings 410 of the central brackets 400. For example, each of the two or more sets 454 can include, for example, three heat sink fins 452, which are arranged vertically and extend through the bracket 400 into the region between the main printed circuit board 210 and the bracket 400. In addition, the pass-through heat sink 450 can be secured to the bracket 400 with a pair of opposing tabs 600.

Figure 6:
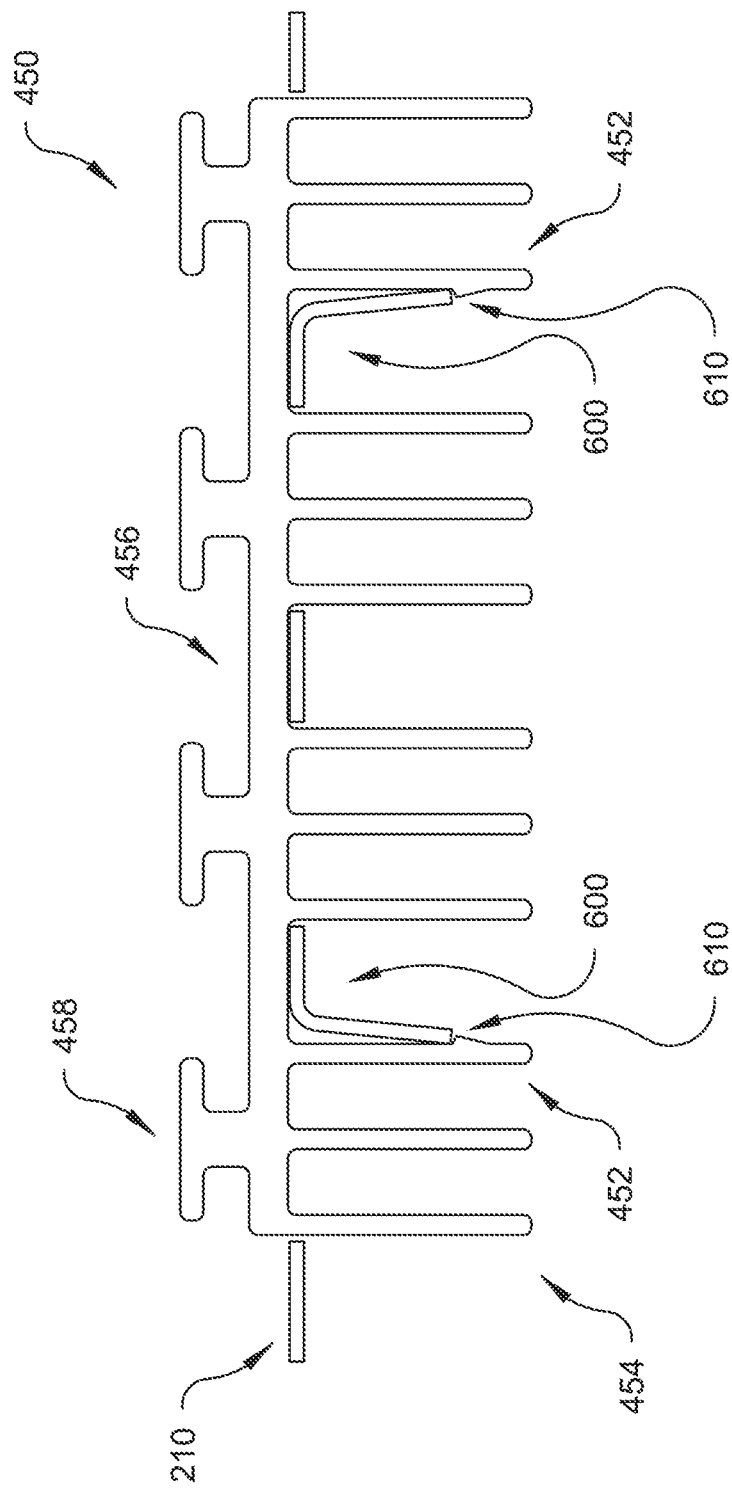
FIG. 6 is an illustration of heat sink fins with opposing angled tabs configured to retain the pass-through heat sink within openings in the central bracket.

FIG. 6 is an illustration of a pass-through heat sink 450 with a pair of opposing angled tabs 600 configured to retain the pass-through heat sink 450 within the openings 410 in the central bracket 400. As shown in FIG. 6, the pass-through heat sink 450 can include opposing latch features 610, for example, on two (2) of the plurality of heat sink fins 452. In accordance with an exemplary embodiment, the angled tabs 600 can have an angular shape, for example, a slightly greater than 90 degree shape that engages the opposing latch features 610 on two of the plurality of heat sink fins 452. For example, each of the opposing tabs 600 can be an approximately 90 degree clip. In accordance with an exemplary embodiment, the pair of opposing angled tabs 600 are configured to be arranged between adjacent sets of fins 454 with one portion of the tab 600 in contact with the back side of the bracket 400 and another portion of the tab in contact with the latch feature 610 on a side surface of a heat sink fin 452. The opposing angled tabs 600 are arranged such that the portion of the tab 600 in contact with the back side of the bracket 400 is innermost or closes to the center of the pass-through heat sink 450 relative to the other portion of the tab 600 in contact with the notch 610 on the heat sink fin 452. The length of the plurality of heat sink fins 452 and angled tabs 600 are preferably configured such that the plurality of heat sink fins 452 and the angled tabs 600 can flex slightly, so that the pass-through heat sink 450 can be assembled (or attached) and retained to the central bracket 400 rather easily and without additional tools or fasteners.

Figure 7:
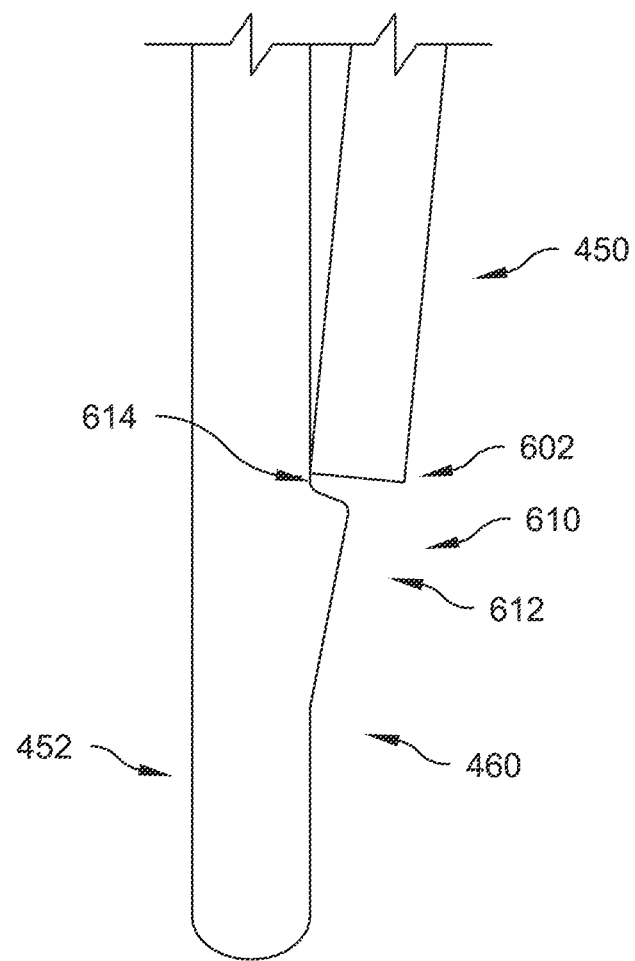
FIG. 7 is an illustration of a latch feature of the opposing angled tabs as shown in FIG. 6.

FIG. 7 is an illustration of a latch feature 610 and an opposing angled tab 600 as shown in FIG. 6. As shown in FIG. 7, the latch feature 610 is preferably a notch 612 extending outward or slight protrusion arranged on a side portion 460 of the heat sink fin 452. The notch or slight protrusion 612 can include a base portion 614 configured to receive an end portion 602 of the angled tab 600. In accordance with an exemplary embodiment, the opposing angled tabs 600 can but does not have to be made of a same material of the plurality of heat sink fins 452, for example, aluminum, an aluminum alloy, copper, and/or a copper alloy.

Figure 8:
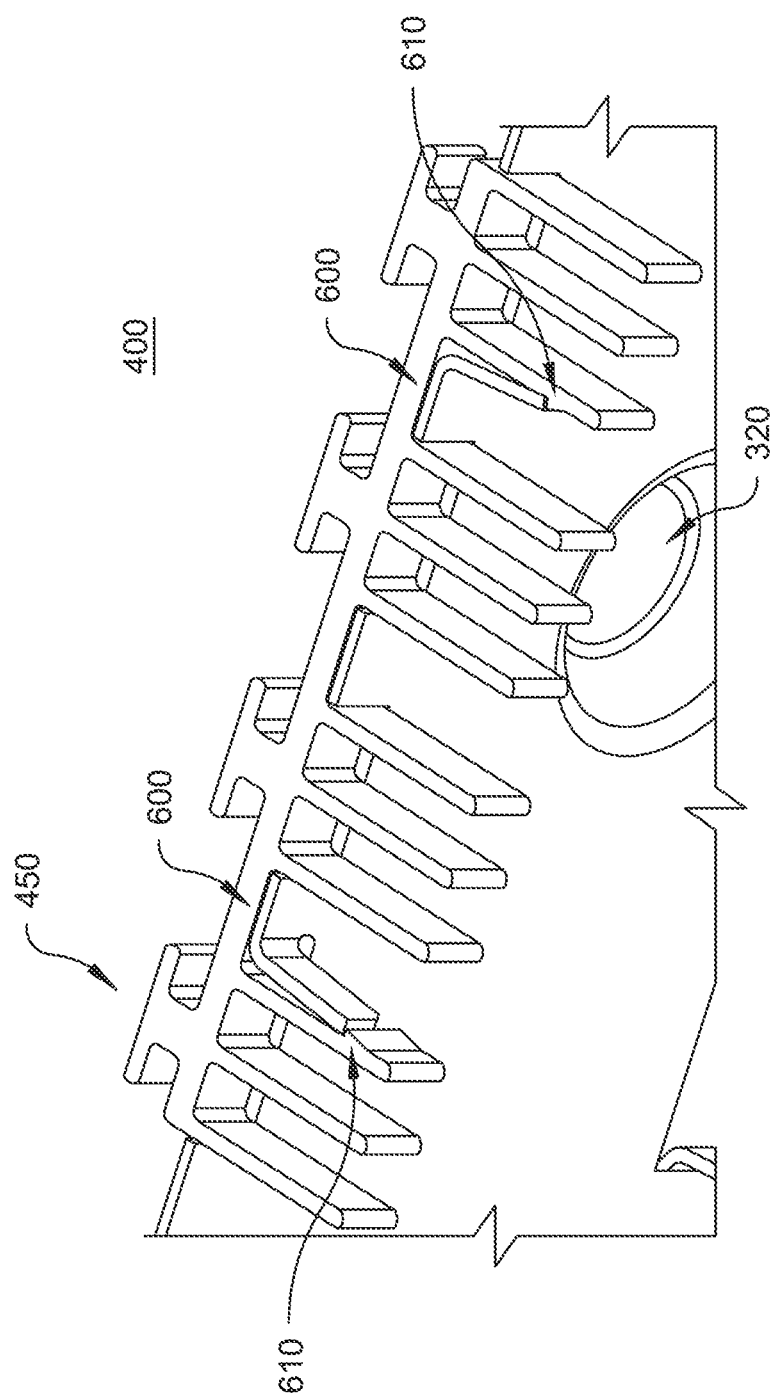
FIG. 8 is an illustration of a pass-through heat sink in the central bracket in accordance with an exemplary embodiment.

FIG. 8 is an illustration of a pass-through heat sink 450 in the central bracket 400 in accordance with an exemplary embodiment. As shown in FIG. 8, the pass-through heat sink 450 is inserted into the bracket 400 and secured with the pair of opposing angled tabs 600, which are secured to the latch feature 610 on the side of the heat sink fin 452. In addition, one or more optional heat domes 320 can be manufactured into the central bracket 400.

In accordance with an exemplary embodiment, as shown in FIGS. 4-8, one or more pass-through heat sinks 450 can be added to the central bracket 220, 400, and arranged between the main printed circuit board 210 and the Wi-Fi printed circuit board 230 with relatively no additional costs. In accordance with an exemplary embodiment, the one or more pass-through heat sinks 450 can be arranged to contact the main printed circuit board 210, for example, through a thermal interface material (TIM). In addition, the one or more pass-through heat sinks 450, can be attached or secured to the central bracket 220, 400 with relatively no force or tools through the use, for example, opposing angled tabs 600. In addition, if necessary, the pass-through heat sink 450 can be re-used on other products with a same Wi-Fi layout and/or separated and recycled.

While various exemplary embodiments of the disclosed heat sink have been described above it should be understood that they have been presented for purposes of example only, not limitations. It is not exhaustive and does not limit the disclosure to the precise form disclosed. Modifications and variations are possible in light of the above teachings or may be acquired from practicing of the disclosure, without departing from the breadth or scope.

What is claimed is:

1. An assembly configured to dissipate heat in a gateway, the assembly comprising:
    a vertically oriented main printed circuit board with one or more components;
    a vertically oriented Wi-Fi printed circuit board with one or more front-end modules configured to deliver broadband wireless access; and
    a bracket, the bracket including one or more openings extending from a front side to a back side of the bracket; and
    a plurality of heat sink fins attached to a base member, and wherein the base member is configured to be attachable to the front side of the bracket and the plurality of heat sink fins extend through the one or more openings to the back side of the bracket,
    wherein the bracket is a vertically oriented bracket arranged between the vertically oriented main printed circuit board and the vertically oriented Wi-Fi printed circuit board, the plurality of heat sink fins being attached to two or more base members, and wherein each of the two or more base members with the plurality of heat sink fins is arranged horizontally on the bracket on a side of the vertically oriented Wi-Fi printed circuit board and the plurality of fins extending into a gap between the vertically oriented bracket and the vertically oriented main printed circuit board.

2. The assembly according to claim 1, wherein the plurality of heat sink fins are arranged on the base member in two or more sets of heat sink fins.

3. The assembly according to claim 2, wherein each of the two or more sets of heat sink fins including two or more fins.

4. The assembly according to claim 1, wherein the base member with the plurality of heat sink fins is arranged horizontally on the bracket, and the plurality of heat sink fins being oriented vertically.

5. The assembly according to claim 1, wherein the bracket is a sheet metal bracket.

6. The assembly according to claim 1, wherein the plurality of heat sink fins are made of aluminum, an aluminum alloy, copper, and/or a copper alloy.

7. The assembly according to claim 1, further comprising:
    a pair of opposing angled tabs, the pair of opposing angled tabs configured to be placed on the back side of the bracket between adjacent sets of fins.

8. The assembly according to claim 7, wherein each of the pair of opposing angled tabs are configured to engage a notch extending outward from a fin of the plurality of heat sink fins and configured to secure the plurality of heat sink fins to the back side of the bracket.

9. The assembly according to claim 1, further comprising:
    one or more heat sink domes on the front side of the bracket.

10. An assembly comprising:
a vertically oriented main printed circuit board;
a vertically oriented Wi-Fi printed circuit board with one or more front-end modules configured to deliver broadband wireless access;
a vertically oriented bracket arranged between the vertically oriented main printed circuit board and the vertically oriented Wi-Fi printed circuit board, the bracket including one or more openings extending from a front side to a back side of the vertically oriented bracket; and
a plurality of heat sink fins attached to a base member, and wherein the base member is configured to be attachable to the front side of the bracket and the plurality of heat sink fins extend through the one or more openings to the back side of the bracket, the front side of the bracket being on a side of the vertically oriented Wi-Fi printed circuit board and the back side being on a side of the vertically oriented main printed circuit board.

11. The assembly according to claim 10, wherein the plurality of heat sink fins are arranged on the base member in two or more sets of heat sink fins.

12. The assembly according to claim 11, wherein each of the two or more sets of heat sink fins including two or more fins.

13. The assembly according to claim 10, wherein the base member with the plurality of heat sink fins is arranged horizontally on the vertically oriented bracket.

14. The assembly according to claim 10, wherein the vertically oriented bracket is a sheet metal bracket.

15. The assembly according to claim 10, wherein the plurality of heat sink fins are made of aluminum, an aluminum alloy, copper, and/or a copper alloy.

16. The assembly according to claim 10, further comprising:
a pair of opposing angled tabs, the pair of opposing angled tabs configured to be placed on the back side of the bracket between adjacent sets of fins.

17. The assembly according to claim 16, wherein each of the pair of opposing angled tabs are configured to engage a notch extending outward from a fin of the plurality of heat sink fins and configured to secure the plurality of heat sink fins to the back side of the bracket.

18. The assembly according to claim 10, wherein the vertically oriented main printed circuit board, the vertically oriented Wi-Fi printed circuit board, and the vertically oriented bracket are components of a gateway.

19. The assembly according to claim 10, further comprising:
one or more heat sink domes on the front side of the vertically oriented bracket.

* * * * *